(12) United States Patent
Nakano et al.

(10) Patent No.: US 6,319,598 B1
(45) Date of Patent: Nov. 20, 2001

(54) ELECTROMAGNETIC WAVE ATTENUATING TRANSPARENT MEMBER

(75) Inventors: Satoshi Nakano; Setsuo Tokuhiro; Shingo Nakamura; Tatsuo Ohta, all of Hachioji (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 09/358,557

(22) Filed: Jul. 22, 1999

(30) Foreign Application Priority Data

Jul. 23, 1998 (JP) .................................................. 10-222459
Sep. 28, 1998 (JP) .................................................. 10-273517

(51) Int. Cl.$^7$ ............................. G02B 1/11; H01Q 17/00
(52) U.S. Cl. .................... 428/218; 428/428; 428/432; 428/448; 428/697; 428/699; 428/701; 359/382; 359/385; 359/386; 359/388
(58) Field of Search ................... 428/218, 428, 428/432, 448, 697, 699, 701, 913; 359/382, 385, 386, 388

(56) References Cited

U.S. PATENT DOCUMENTS 5,508,091 * 4/1996 Austin .
5,536,580 * 7/1996 Ikadai et al. .
5,719,705 * 2/1998 Machol .
5,846,649 * 12/1998 Knapp et al. .
5,891,556 * 4/1999 Anderson et al. .
6,074,730 * 6/2000 Laird et al. .
6,104,534 * 8/2000 Ohta et al. .

FOREIGN PATENT DOCUMENTS 11-73119   3/1999  (JP) .

* cited by examiner

Primary Examiner—Deborah Jones
Assistant Examiner—Jason Savage
(74) Attorney, Agent, or Firm—Finnegan, Henderson, Farabow, Garrett, & Dunner, L.L.P.

(57) ABSTRACT

An electromagnetic wave attenuating transparent member includes; a transparent base material, and a plurality of structural layers including at least one transparent conductive layer. Sheet resistivity of the electromagnetic wave attenuating transparent member is 100 $\Omega/cm^2$ or less, and the plurality of structural layers include a first layer and a second layer which is provided to be farther than the first layer from the transparent base material, and has density which is higher than that of the first layer.

32 Claims, 2 Drawing Sheets

ELECTROMAGNETIC WAVE ATTENUATING TRANSPARENT MEMBER

BACKGROUND OF THE INVENTION

The present invention relates to an electromagnetic wave attenuating transparent member, and it is preferably related to an electromagnetic wave attenuating transparent member having an antireflection effect, in particular.

In recent years, there have been doubts that electromagnetic waves emitted from office automation equipment, cathode-ray tubes of television sets and other electronic equipment might have an influence on the human body, and a growing interest in this matter is now taken.

A method which was taken frequently in the past to avoid the influence of these electromagnetic waves was to cover with a conductive member capable of looking through like a wire net.

However, when a cathode-ray tube is covered with the conductive member, a screen becomes hard to be observed, resulting in fatigue of eyes of a user, which has been a problem.

In view of the foregoing, there has been proposed a technology wherein a layered body representing a light-transmitting thin film is provided on the surface of a screen in place of a net of metal fine wires, in order to obtain not only an effect of attenuating electromagnetic waves but also an effect of preventing reflection. For example, in the technology disclosed in TOKKAIHEI No. 6-34801, there is used a three-phase layered body which has a layer of indium tin oxide (ITO) as a transparent and conductive layer, a layer of silicon oxide as a low refractive index layer, and a layer of titanium oxide as a high refractive index layer in this order from the base material. In this technology, however, the transparent and conductive layer is as thin as 300 Å in thickness and an effect of shielding electromagnetic waves is small, resulting in insufficient effects, although the screen became easy to see due to the effect of preventing reflection.

In the technology disclosed in TOKKAIHEI No. 11-73119, on the other hand, a high refractive index layer contains indium tin oxide as a material and its thickness is made to be 1000 Å or more to serve as a transparent and conductive layer in the layer structure of a light-transmitting low refractive index layer and a light-transmitting high refractive index layer.

Owing to a conductive layer which has been made thick, sheet resistivity has been lowered, and an effect of shielding electromagnetic waves has been improved, resulting in efficiency which is sufficient in practical use. However, when stored under the environmental conditions of high temperature and high humidify, a coated layer tended to have color unevenness and to be floated off, which have been problems of resistance to surroundings. In particular, when the coat mentioned above was formed on the transparent plastic base material, these problems were noticeable.

With regard to the coat representing a thin film having the effect of shielding electromagnetic waves stated above, an occasion where it is provided on a transparent member having a curved surface like a lens is also considered in addition to an occasion where it is provided on a flat transparent base material or on a transparent base film material. When coating a thin layer having the effect of shielding electromagnetic waves mentioned above on a positive meniscus type lens, it was normal to coat on the concave surface. This was to prevent occurrence of scratches and to prevent dirt. However, in the case of a coat for electromagnetic wave attenuation and for prevention of reflection which has a transparent and conductive layer with a thickness of 1000 Å or more and is coated on a concave surface, there has been a problem that exfoliation of the coat and color unevenness of the coat color were caused by expansion and contraction of the lens base material when the coat was left for one week under the conditions of high temperature of 60° C. and high humidity of 90%.

When coating a thin layer having an effect of shielding electromagnetic waves on a positive meniscus lens and coating it on a negative meniscus lens, the direction of deformation of the lens is changed. It was therefore found that it is necessary to determine whether to coat on the convex surface of the lens or to coat on the concave surface of the lens, taking the direction of deformations in each lens into consideration.

SUMMARY OF THE INVENTION

An object of the invention is to obtain an electromagnetic wave attenuating transparent member which can intercept electromagnetic waves emitted from office automation equipment, cathode-ray tubes of television sets and from other equipment, disturbs no field of vision, lessens fatigue of eyes, and is highly resistant to surroundings.

The object of the invention can be attained by either one of the following structures.

Structure 1: An electromagnetic wave attenuating transparent member comprising;
a transparent base material, and
a plurality of structural layers including at least one transparent and conductive layer,
wherein sheet resistivity of the electromagnetic wave attenuating transparent member is 100 $\Omega/cm^2$ or less, and a plurality of structural layers include therein the first layer and the second layer which is provided to be farther than the first layer in terms of the distance from the transparent base material, and has density which is higher than that of the first layer.

Structure 2: The electromagnetic wave attenuating transparent member according to Structure 1, wherein the plural structural layers include;
the first high refractive index layer,
the first low refractive index layer,
the second high refractive index layer, and
the second low refractive index layer,
which are arranged in this order from one that is closest to the transparent base material, and the second high refractive index layer is the transparent and conductive layer mentioned above.

Structure 3: The electromagnetic wave attenuating transparent member according to Structure 2, wherein the third low refractive index layer is provided between the transparent base material and the first high refractive index layer.

Structure 4: The electromagnetic wave attenuating transparent member according to Structure 3, wherein the first low refractive index layer, the second low refractive index layer and the third low refractive index layer are made of silicon oxide.

Structure 5: The electromagnetic wave attenuating transparent member according to Structure 2, wherein sheet resistivity of the transparent and conductive layer is 100 $\Omega/cm^2$ or less.

Structure 6: The electromagnetic wave attenuating transparent member according to Structure 1, wherein the first layer and the second layer which has density higher than that of the first layer are not adjoining layers each other.

Structure 7: The electromagnetic wave attenuating transparent member according to Structure 6, wherein both the first layer and the second layer represent a low refractive index layer.

Structure 8: The electromagnetic wave attenuating transparent member according to Structure 7, wherein the first layer is the low refractive index layer closest to the transparent base plate among the low refractive index layers, and the second layer is the low refractive index layer farthest from the transparent base plate among the low refractive index layers.

Structure 9: The electromagnetic wave attenuating transparent member according to Structure 8, wherein the plural structural layers include;

the first high refractive index layer, the first low refractive index layer, the second high refractive index layer, and the second low refractive index layer, which are arranged in this order from one that is closest to the transparent base material, and the second high refractive index layer is the transparent and conductive layer mentioned above, the first low refractive index layer is the first layer, and the second low refractive index layer is the second layer having density higher than that of the first layer.

Structure 10: The electromagnetic wave attenuating transparent member according to Structure 8, wherein the plural structural layers include;

the first high refractive index layer, the first low refractive index layer, the second high refractive index layer, the second low refractive index layer, and the third low refractive index layer, which are arranged in the order of the third low refractive index layer, the first high refractive index layer, the first low refractive index layer, the second high refractive index layer, and the second low refractive index layer, from one that is closest to the transparent base material, and the second high refractive index layer is the transparent and conductive layer mentioned above, the third low refractive index layer is the first layer, and the second low refractive index layer is the second layer having density higher than that of the first layer.

Structure 11: The electromagnetic wave attenuating transparent member according to Structure 7, wherein the first layer and the second layer are made of the same material.

Structure 12: The electromagnetic wave attenuating transparent member according to Structure 11, wherein the material stated above is silicon oxide.

Structure 13: The electromagnetic wave attenuating transparent member according to Structure 6, wherein the first layer and the second layer represent a high refractive index layer.

Structure 14: The electromagnetic wave attenuating transparent member according to Structure 13, wherein the second layer is the transparent and conductive layer stated above.

Structure 15: The electromagnetic wave attenuating transparent member according to Structure 14, wherein the first layer is also the transparent and conductive layer.

Structure 16: The electromagnetic wave attenuating transparent member according to Structure 15, wherein the plural structural layers include;

the first high refractive index layer, the first low refractive index layer, the second high refractive index layer, and the second low refractive index layer, which are arranged in this order from one that is closest to the transparent base material, and the second high refractive index layer is the transparent and conductive layer mentioned above, the first high refractive index layer is the first layer, and the second high refractive index layer is the second layer having density higher than that of the first layer.

Structure 17: The electromagnetic wave attenuating transparent member according to Structure 16, wherein the third low refractive index layer is provided between the transparent base material and the first high refractive index layer.

Structure 18: The electromagnetic wave attenuating transparent member according to Structure 15, wherein the first layer and the second layer are made of the same material.

Structure 19: The electromagnetic wave attenuating transparent member according to Structure 18, wherein the material stated above contains indium oxide or indium.

Structure 20: The electromagnetic wave attenuating transparent member according to Structure 19, wherein the material stated above is a mixture of indium oxide and tin.

Structure 21: The electromagnetic wave attenuating transparent member according to Structure 1, wherein the first layer and the second layer which has density higher than that of the first layer are adjoining layers each other.

Structure 22: The electromagnetic wave attenuating transparent member according to Structure 21, wherein the first layer and the second layer represent a high refractive index layer.

Structure 23: The electromagnetic wave attenuating transparent member according to Structure 22, wherein the second layer is the transparent and conductive layer stated above.

Structure 24: The electromagnetic wave attenuating transparent member according to Structure 23, wherein the first layer is also the transparent and conductive layer.

Structure 25: The electromagnetic wave attenuating transparent member according to Structure 24, wherein the first layer and the second layer are made of the same material and that material contains indium oxide or indium.

Structure 26: The electromagnetic wave attenuating transparent member according to Structure 24, wherein the material stated above is a mixture of indium oxide and tin.

Structure 27: The electromagnetic wave attenuating transparent member according to Structure 23, wherein the plural structural layers include;

the first high refractive index layer, the first low refractive index layer, the third high refractive index layer, the second high refractive index layer, and the second low refractive index layer, which are arranged in this order from one that is closest to the transparent base material, and the second high refractive index layer is the transparent and conductive layer mentioned above, the third high refractive index layer is the first layer, and the second high refractive index layer is the second layer having density higher than that of the first layer.

Structure 28: The electromagnetic wave attenuating transparent member according to Structure 27, wherein the third low refractive index layer is provided between the transparent base material and the first high refractive index layer.

Structure 29: The electromagnetic wave attenuating transparent member according to Structure 23, wherein the second layer contains indium oxide or indium, and the first layer contains at least one kind of zirconium oxide, titanium oxide and tantalum oxide.

Structure 30: The electromagnetic wave attenuating transparent member according to Structure 1, wherein the transparent base material is a lens.

Structure 31: The electromagnetic wave attenuating transparent member according to Structure 30, wherein the lens stated above is a positive meniscus lens and the plural structural layers are provided on the convex side.

Structure 32: The electromagnetic wave attenuating transparent member according to Structure 30, wherein the lens stated above is a negative meniscus lens and the plural structural layers are provided on the concave side.

Structure 33: The electromagnetic wave attenuating transparent member according to Structure 1, wherein the transparent base material is in a film shape.

Structure 34: The electromagnetic wave attenuating transparent member according to Structure 1, wherein the transparent base material is a flat plate.

Structure 35: The electromagnetic wave attenuating transparent member according to Structure 1, wherein the transparent base material is made of plastic.

Structure 36: The electromagnetic wave attenuating transparent member according to Structure 1, wherein the transparent base material is made of glass.

Structure 37: An electromagnetic wave attenuating and antireflection layer structured with a light-transmitting thin layer in which five layers representing the first low refractive index layer, the first high refractive index layer, the second low refractive index layer, the second high refractive index layer and the third low refractive index layer are laminated in this order from the transparent base material, wherein sheet resistivity of the second high refractive index light-transmitting thin layer is 100 $\Omega/cm^2$ or less, a material for the thirst, second and third low refractive index and light-transmitting thin layers stated above is silicon oxide, and structure of the first low refractive index layer is different from that of the third low refractive index layer.

Structure 38: The electromagnetic wave attenuating and antireflection layer according to Structure 37 wherein density of the third low refractive index layer is higher than that of the first low refractive index layer.

Structure 39: The electromagnetic wave attenuating and antireflection layer according to Structure 37 or 38 wherein the first and second high refractive index light-transmitting layers are made to be a transparent and conductive layer, and the structure of the first layer is made to be different from that of the second layer.

Structure 40: The electromagnetic wave attenuating and antireflection layer according to Structure 39 wherein the second high refractive index transparent and conductive layer is structured with two kinds of layers.

Structure 41: The electromagnetic wave attenuating and antireflection layer according to Structure 40 wherein the two kinds of layers stated above are arranged so that the layer of lower density is closer to the base material and the layer of higher density is farther from the base material.

Structure 42: The electromagnetic wave attenuating and antireflection layer according to Structure 40 or Structure 41 wherein the two kinds of layers stated above are arranged so that the layer with the structure of grown grains is closer to the base material and the layer with the structure with less grains and higher uniformity is farther from the base material.

Structure 43: The electromagnetic wave attenuating and antireflection layer according to either one of Structures 39–42, wherein the first high refractive index transparent and conductive layer is formed to be of the structure with one kind of a layer.

Structure 44: The electromagnetic wave attenuating and antireflection layer according to either one of Structure 43, wherein the first high refractive index transparent and conductive layer is formed to be of the structure with a layer of lower density.

Structure 45: The electromagnetic wave attenuating and antireflection layer according to Structure 43 or Structure 44, wherein the first high refractive index transparent and conductive layer is made to be of the structure of grown grains.

Structure 46: The electromagnetic wave attenuating and antireflection layer according to either one of Structures 39–45, wherein the first high refractive index transparent and conductive layer is made of indium oxide or of a mixture of indium oxide and tin.

Structure 47: An optical member having a layer for preventing reflection wherein its convex surface is provided with the electromagnetic wave attenuating and antireflection layer according to either one of Structures 37–46.

Structure 48: A lens having thereon the antireflection layer according to Structure 47 wherein the optical member is a meniscus lens and its convex surface is provided with the electromagnetic wave attenuating and antireflection layer.

Structure 49: An electromagnetic wave attenuating and antireflection coat wherein the antireflection coat having a transparent conductive layer formed on a transparent base material has a layer structure in which one intermediate layer or plural intermediate layers each having a different layer structure or a different material are provided on the halfway point of the transparent and conductive layer.

Structure 50: The electromagnetic wave attenuating and antireflection coat according to Structure 49, wherein the transparent and conductive layer is formed with oxides containing therein indium oxide or indium as main components, and the intermediate layer is formed with a mixture containing silicon oxide, zirconium oxide, titanium oxide, tantalum oxide or various oxides stated above as main components, or with oxides which have density lower than that of the transparent and conductive layer and contain indium oxide or indium as main components.

Structure 51: The electromagnetic wave attenuating and antireflection coat according to Structure 49 or Structure 50, wherein one silicon oxide layer or two silicon oxide layers are formed as the intermediate layer.

Structure 52: The electromagnetic wave attenuating and antireflection coat according to Structure 49 or Structure 50, wherein one layer or two layers representing a zirconium oxide layer or a layer of a mixture of zirconium oxide and titanium, are formed as the intermediate layer.

Structure 53: The electromagnetic wave attenuating and antireflection coat according to Structure 49 or Structure 50, wherein one layer or two layers representing a titanium oxide layer, a tantalum oxide layer, or a layer of a mixture of titanium oxide and tantalum oxide, are formed as the intermediate layer.

Structure 54: The electromagnetic wave attenuating and antireflection coat according to Structure 49 or Structure 50, wherein the transparent and conductive layer is formed with oxides containing therein indium oxide or indium as main components, and the intermediate layer is formed with oxides which have density lower than that of the transparent and conductive layer and contain indium oxide or indium as main components.

Structure 55: An electromagnetic wave attenuating and antireflection coat wherein the antireflection coat having a transparent and conductive layer formed on a transparent base material has a layer structure in which a layer made of material different from that of the transparent and conductive layer is provided as a subbing layer for the transparent and conductive layer.

Structure 56: The electromagnetic wave attenuating and antireflection coat according to Structure 55, wherein the transparent and conductive layer is formed with oxides containing therein indium oxide or indium as main components, and the subbing layer is made to be a layered body including a high refractive index metal oxide layer and a silicon oxide layer which are arranged in this order from a base material.

Structure 57: The electromagnetic wave attenuating and antireflection coat according to Structure 56, wherein the high refractive index metal oxide layer is formed with oxides containing zirconium oxide, titanium oxide, tantalum oxide or various oxides stated above as main components.

DETAILED DESCRIPTION OF THE PREFERRED EMBODIMENT

Figure 1:
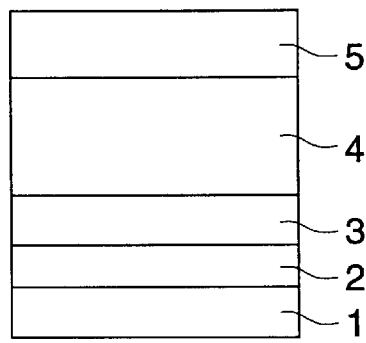
FIG. 1 shows a concrete example of the structure wherein first high refractive index layer 2, first low refractive index layer 3, second high refractive index layer 4 and second low refractive index layer 5 are layered in this order from transparent base material 1, with regard to the layer structure of an electromagnetic wave attenuating transparent member.

The electromagnetic wave attenuating transparent member of the invention will be explained in detail, as follows.

The electromagnetic wave attenuating transparent member has sheet resistivity of not more than 100 $\Omega/cm^2$ and has a transparent base material and plural structural layers. It is more preferable that sheet resistivity is not more than 50 $\Omega/cm^2$. It is further preferable that the rate of attenuation of electromagnetic wave of the electromagnetic wave attenuating transparent member is not more than 10 dB. It is preferable that the electromagnetic wave attenuating transparent member has transmission factor of not less than 25% for visible light. The transmission factor of not less than 50% is further preferable, and that of not less than 80% is more preferable. However, the transmission factor of not more than 25% for visible light is also acceptable, depending upon how the electromagnetic wave attenuating transparent member is used. For example, when the electromagnetic wave attenuating transparent member is a sunglasses, the transmission factor for visible light may be 25% or less.

Incidentally, the sheet resistivity can be measured by the use of a shield material tester made by ADVANTEST CO.

As a concrete example of the electromagnetic wave attenuating transparent member, there may be given various ones depending on types and shapes of transparent base materials.

For example, when the transparent base material is a lens, there may be given glasses, sunglasses, contact lenses and a camera lens. Further, when the transparent base material is a flat plate or it is film-shaped, there may be given a filter and an electromagnetic wave attenuating transparent film each being provided to cover office automation equipment, a cathode-ray tube, a plasma display, a display of a car navigation system and a meter panel of a car.

With regard to a shape of the transparent base material, it is possible to use various ones such as a lens-shaped one, a flat-plate-shaped one and a film-shaped one such as a thin film. It is further possible to color the transparent base material, or to add to it UV-absorbent agents.

As a material of the transparent base body, there may be given glass base material and plastic base material. When the transparent base material is a plastic base material, in particular, an effect of the invention is remarkable, which is preferable. As a plastic base material, acrylic resin, polycarbonate resin, polyolefin type resin (ex. "Zeonex", "Apel", "Arton"), diethyleneglicol bis allylcarbonate (ex. "CR-39"), polyurethane resin, norbornane type resin, polystylene resin, celulose type resin or PET resin may be used. Either colorless transparent resin or colored transparent resin may also be acceptable. Either thermosetting resin or thermoplastic resin (acrylic resin, polycarbonate resin, and polyolefin type resin) may also be acceptable.

It is preferable that the transparent base material has transmission factor of not less than 25% for visible light. The transmission factor of not less than 50% is further preferable, and that of not less than 80% is more preferable.

It is also possible to provide various coats such as a hard coat on the transparent base material and to provide various structural layers on that coat to improve surface strength of the transparent base material and to improve adhesive power between structural layers of various types and the transparent base material.

A hard coat may be formed in the known method to use resins such as, for example, a thermosetting resin, a UV hardenable resin or an electron-beam hardenable resin. In this case, when the refractive index of the hard coat is made to be close to that of the base plate to the utmost, occurrence of color unevenness can be lessened.

Next, the layer structure of an electromagnetic wave attenuating transparent member will be explained. The electromagnetic wave attenuating transparent member has plural structural layers including at least one transparent conductive layer. As a transparent conductive layer, it is possible to use, for example, indium, indium oxide, a mixed oxide (ITO) of indium oxide and tin oxide, a mixture of indium and tin, a mixed oxide (mixture rate of zinc is 2–10 wt %) of indium and zinc, tin, tin oxide, a mixture of tin oxide and antimony, antimony, antimony oxide, zinc, zinc oxide, manganese, manganese oxide or a mixture of them. In particular, it is preferable to form with oxides containing indium such as indium or ITO as main components.

When using ITO, an ITO-P layer made under vacuum from a mixture of indium oxide and tin oxide which serves as an evaporating material and an ITO-M layer made under vacuum from evaporating materials including indium and tin (metal) through simultaneous evaporation and oxidization can be used. It is possible for ITO to change a value of sheet resistivity by changing content of tin. It is preferable to make content of tin to be 10 wt % or less, when improving conductivity. More preferable is 2–10 wt %. However, when using the ITO layer as a reflectance adjusting layer or a stress adjusting layer without aiming conductivity, a ratio of tin and indium can be determined appropriately depending on how the ITO layer is used.

Further, with regard to these substances structuring the transparent and conductive layer, they may be used as evaporating materials for the transparent and conductive layer by composing at a prescribed ratio in advance, and in addition to that, it is possible to obtain a transparent and conductive layer by evaporating metal before oxidization as evaporating materials in a reaction gas, or by forming a metal layer with metal before oxidization and by exposing the metal layer to plasma of a reaction gas.

It is preferable that sheet resistivity of the transparent and conductive layer is 100 $\Omega/cm^2$ or less. 50 $\Omega/cm^2$ is more preferable. It is further preferable that an electromagnetic wave attenuating rate is 10 dB or less. A layer thickness of the transparent and conductive layer is preferably 500 Å or more, and it is preferable that the layer thickness is 1000 Å or more, and in the case of a single transparent and conductive layer, in particular, 1000 Å or more is more preferable. It is further preferable to be of a thickness of not more than 10 $\mu$m, and 5 $\mu$m or less is more preferable. It is preferable that the transparent and conductive layer has transmission factor of not less than 25% for visible light. The transmission factor of not less than 50% is further preferable, and that of not less than 80% is more preferable.

It is further preferable that a high refractive index layer and a low refractive index layer are provided alternately in the structure of plural layers of the electromagnetic wave attenuating transparent member in the invention to obtain an effect of preventing reflection.

It is preferable that four or more layers are provided on a transparent base material so that a high refractive index layer and a low refractive index layer may be provided alternately, and a layer which is farthest from a transparent base plate is a low refractive index layer. The more preferable is that five or more layers are provided, and a layer which is farthest from a transparent base plate and a layer which is closest to a transparent base plate are low refractive index layers, and a high refractive index layer and a low refractive index layer are provided alternately. Further, the structure wherein two high refractive index layers are superposed is also acceptable.

Incidentally, it is preferable that a high refractive index layer is higher than its adjoining layer in terms of the refractive index, and the refractive index of the high refractive index layer which is 1.8 or more is preferable.

As a high refractive index layer, it is preferable to use titanium oxide, zirconium titanate, zirconium oxide, cerium oxide, tantalum oxide, praseodymium oxide, lanthanum oxide, yttrium oxide, aluminum oxide, zonc oxide, hafnium oxide, aluminum oxide and yttrium oxide or mixtures thereof. It is also possible to provide a material described in the above explanation of transparent and conductive layer as a high refractive index layer. Namely, the transparent and conductive layer may also be made to serve also as a high refractive index layer.

On the other hand, it is preferable that a low refractive index layer is lower than its adjoining layer in terms of the refractive index, and that the refractive index of the low refractive index layer is 1.55 or less.

As a low refractive index layer, it is preferable to use silicon oxide such as silicon oxide and silicon dioxide. Further, material whose refractive index is within a range of 1.5–1.8 is made to be a low refractive index layer or a high refractive index layer depending on the layer structure.

It is preferable that both low refractive index layer and high refractive index layer have transmission factor of not less than 25% for visible light. The transmission factor of not less than 50% is further preferable and that of not less than 80% is more preferable. Further, it is preferable that a thickness of each of the low refractive index layer and the high refractive index layer is 5 $\mu$m or less. The more preferable is 1 $\mu$m or less. The thickness of 10 Å or more is preferable.

Various types of high refractive index layers and low refractive index layers of transparent and conductive layers can be formed through conventional known means. A method for forming these thin layers used in the invention includes, for example, an evaporation method, RF ion plating method, a spattering method and CVD.

It is also possible to provide a water-repelling coat or various types of hard coat on the outermost surface of an electromagnetic wave attenuating transparent member, namely on the outermost surface of structural layers. For example, there is given a method for coating, or forming through a vacuum evaporation method, a compound containing perfluoroalkyl group on the surface.

When providing various structural layers and various coats such as a hard coat and a water-repelling coat, it is possible to apply known preprocessing such as processing with silane compound, plasma processing or UV processing on various structural layers and various coats, to improve adhesion and strength. It is further preferable that an outermost layer in plural structural layers is a low refractive index layer. It is also possible to cement a structural layer on the transparent base material by the use of adhesives. It is preferable that a transparent and conductive layer of an electromagnetic wave attenuating transparent material is made of ITO-M. It is more preferable that a layer made of ITO-P is closer to the transparent base material than a layer made of ITO-M is. It is more preferable that a layer whose thickness is 500 Å or more, preferably 800 Å or more is made to be an ITO-M layer.

An electromagnetic wave attenuating transparent member of the invention has two layers each having different density in plural structural layers. Namely, the plural structural layers have therein the first layer and the second layer which is provided to be farther than the first layer in terms of a distance from a transparent base material, and has density higher than that of the first layer.

The level of density can be recognized by observing a layer under an electron microscope. In the layer with high density, the state of accumulation of the layer is uniform and the number of lumps is less. In the layer with low density, on the other hand, the state of accumulation of the layer is not uniform and many lumps are generated, resulting in coarse feeling or porous feeling.

Density of each layer can also be judged by packing density. The packing density is defined to be a ratio of a layer thickness of a single layer in a vacuum to that in the atmosphere. Namely, Packing Density=Tv/Ta where,
Tv represents a layer thickness in a vacuum, and
Ta represents a layer thickness in the atmosphere.

A layer with great packing density is a layer with high density, and a layer with small packing density is a layer with low density.

Further, density differs depending on the crystal structure. In the case of the crystal structure wherein a combination with molecules adjoining in the horizontal direction is stronger than the structure like columnar crystal, density is high.

Incidentally, the first layer and the second layer which is higher than the first layer in terms of density may either be adjoining or be not adjoining.

When the first layer and the second layer are not provided to be adjoined each other, namely, when the first layer and the second layer are provided to be away from each other, it is preferable that both the first layer and the second layer are a low refractive index layer, or both of them are a high refractive index layer. It is more preferable that the first layer and the second layer are of the same material.

When the first layer and the second layer are provided to be away from each other and both of the first layer and the second layer represent a high refractive index layer, it is preferable that the second layer is a transparent and conductive layer, and it is more preferable that the first and second layers represent a transparent and conductive layer. When the first and second layers represent a transparent and conductive layer, it is preferable that the first layer is an ITO-P layer which is made with a mixture of indium oxide and tin oxide serving as evaporating material and the second layer is an ITO-M layer which is made through simultaneous evaporation and oxidization with indium and tin (metal) both serving as evaporating materials. Incidentally, it is preferable that a chamber wherein an ITO-P layer and an ITO-M layer are prepared is made to be of a certain degree of vacuum, and then is injected with an active gas containing at least oxygen, for preparing each layer.

When the first layer and the second layer are provided to be away from each other and both of the first layer and the second layer represent a low refractive index layer, it is more preferable that the first layer is a low refractive index layer which is closest to a transparent base plate among the low refractive index layers, and the second layer is a low refractive index layer which is farthest from a transparent base plate among the low refractive index layers. When the first layer and the second layer represent a low refractive index layer and employ the same material, silicon oxide (SiO, SiO$_2$) is preferably used as the same material.

When the first layer and the second layer are provided to adjoin each other, the first layer and the second layer preferably represent a high refractive index layer. It is especially preferable that the second layer is a transparent and conductive layer, and the more preferable is that the first and second layers represent a transparent and conductive layer. What is more preferable is that the same material is used for the first layer and the second layer.

When the first and second layers represent a conductive layer, it is preferable that the first layer is an ITO-P layer which is made under vacuum with a mixture of indium oxide and tin oxide serving as evaporating material and the second layer is an ITO-M layer which is made through simultaneous evaporation and oxidization under vacuum with indium and tin (metal) both serving as evaporating materials.

When the second layer is a transparent and conductive layer and the first layer is a high refractive index layer which is not a transparent and conductive layer, it is preferable that the second layer is an ITO layer and the first layer is a layer containing at least one kind of zirconium oxide, titanium oxide and tantalum oxide.

It is further preferable that a layer which is farthest from a transparent base plate is a layer having high density.

A layer structure of an electromagnetic wave attenuating transparent member will be explained as follows, referring to the drawings and some examples to which the layer structure of an electromagnetic wave attenuating transparent member of the invention is not limited.

First, FIG. 1 shows a concrete example of the structure wherein first high refractive index layer 2, first low refractive index layer 3, second high refractive index layer 4 and second low refractive index layer 5 are laminated in succession from transparent base material 1. By arranging the high refractive index layer and the low refractive index layer alternately as stated above, it is possible to prevent reflection of light and thereby to make a screen easy to see, which is preferable.

The first low refractive index layer 3 and the second low refractive index layer 5 are made of silicon oxide. The second low refractive index layer 5 is higher than the first low refractive index layer 3 in terms of density. Namely, the first layer of the invention is the first low refractive index layer 3 and the second layer of the invention is the second low refractive index layer 5. The second high refractive index layer 4 is a transparent and conductive layer made of ITO whose sheet resistivity is 100 Ω/cm$^2$ or less. The first high refractive index layer 2 is a layer containing at least one kind of zirconium oxide, titanium oxide and tantalum oxide.

Figure 2:
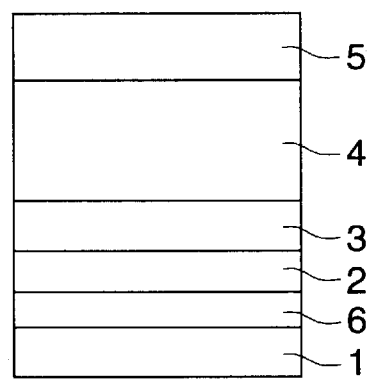
FIG. 2 shows a concrete example of the structure wherein third low refractive index layer 6 is provided between the transparent base material 1 and the first high refractive index layer 2 in FIG. 1.

Next, the concrete example shown in FIG. 2 represents a structure wherein third low refractive index layer 6 is provided between transparent base material 1 and the first high refractive index layer 2 in FIG. 1. Owing to this layer structure, further prevention of light reflection is made possible, which is preferable.

Explanation of layers other than the third low refractive index layer 6 will be omitted here because they are the same as those in FIG. 1. third low refractive index layer 6 is made of silicon oxide, and it is lower than the first low refractive index layer 3 in terms of density. Namely, it is possible either to consider that the first layer of the invention is the first low refractive index layer 3 and the second layer of the invention is the second low refractive index layer 5 or to consider that the first layer of the invention is the third low refractive index layer 6 and the second layer of the invention is the second low refractive index layer 5.

Figure 3:
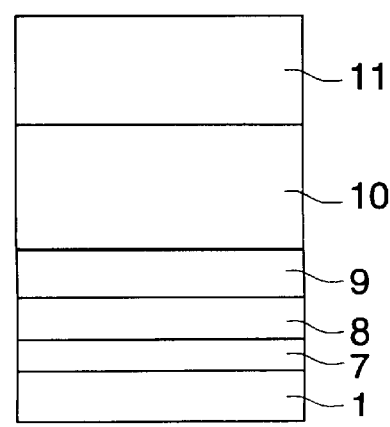
FIG. 3 shows a concrete example of the structure wherein third low refractive index layer 7, first high refractive index layer 8, first low refractive index layer 9, second high refractive index layer 10 and second low refractive index layer 11 are layered in this order from the transparent base material 1.

Next, FIG. 3 shows a concrete example of the structure wherein third low refractive index layer 7, first high refractive index layer 8, first low refractive index layer 9, second high refractive index layer 10 and second low refractive index layer 11 are laminated in succession from transparent base material 1. By arranging the high refractive index layer and the low refractive index layer alternately as stated above, it is possible to prevent reflection of light and thereby to make a screen easy to see, which is preferable.

The first low refractive index layer 9, the second low refractive index layer 11 and the third low refractive index layer 7 are made of silicon oxide. In the concrete example in FIG. 3, density for each of these three layers is the same. Both of the first high refractive index layer 8 and the second high refractive index layer 10 represent a transparent and conductive layer made of ITO whose sheet resistivity is 100 Ω/cm$^2$ or less. The second high refractive index layer 10 is higher than the first high refractive index layer 8 in terms of density. Namely, the first layer of the invention is the third high refractive index layer 8 and the second layer of the invention is the second high refractive index layer 10.

The first high refractive layer 8 representing the first layer is an ITO-P layer which is made under vacuum with a mixture of indium oxide and tin oxide serving as evaporating material and the second high refractive layer 10 representing the second layer is an ITO-M layer which is made through simultaneous evaporation and oxidization under vacuum with indium and tin (metal) both serving as evaporating materials.

Figure 4:
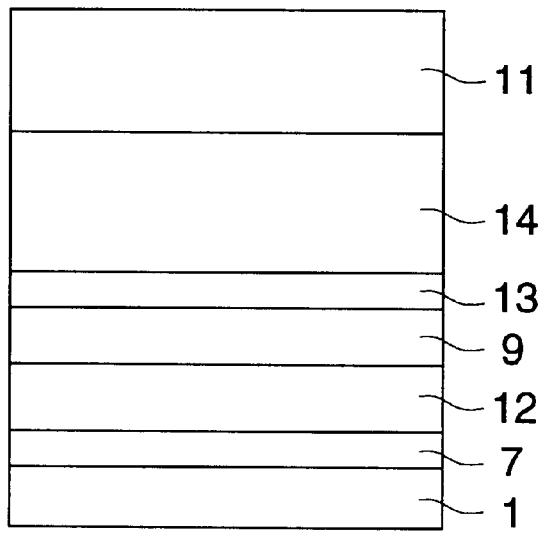
FIG. 4 shows a concrete example of the structure wherein third low refractive index layer 7, first high refractive index layer 12, first low refractive index layer 9, third high refractive index layer 13, second high refractive index layer 14 and second low refractive index layer 11 are layered in this order from the transparent base material 1.

Next, FIG. 4 shows a concrete example of the structure wherein third low refractive index layer 7, first high refractive index layer 12, first low refractive index layer 9, third high refractive index layer 13, second high refractive index layer 14 and second low refractive index layer 11 are laminated in succession from transparent base material 1. By arranging the high refractive index layer and the low refractive index layer alternately as stated above, it is possible to prevent reflection of light and thereby to make a screen easy to see, which is preferable. In the concrete example shown in FIG. 4, third high refractive index layer 13 and second high refractive index layer 14 are provided to adjoin each other.

The first low refractive index layer 9, the second low refractive index layer 11 and the third low refractive index layer 7 are made of silicon oxide. In the concrete example in FIG. 3, density for each of these three layers is the same. Both of the second high refractive index layer 14 and the third high refractive index layer 13 represent a transparent and conductive layer made of ITO whose sheet resistivity is 100 Ω/cm² or less. The second high refractive index layer 14 is higher than the third high refractive index layer 13 in terms of density. Namely, the first layer of the invention is the third high refractive index layer 13 and the second layer of the invention is the second high refractive index layer 14. The first high refractive index layer is a layer containing at least one kind of zirconium oxide, titanium oxide and tantalum oxide. The first high refractive index layer may also be made to be an ITO layer.

The third high refractive index layer 13 representing the first layer is an ITO-P layer which is made under vacuum with a mixture of indium oxide and tin oxide serving as evaporating material and the second high refractive index layer 14 representing the second layer is an ITO-M layer which is made through simultaneous evaporation and oxidization under vacuum with indium and tin (metal) both serving as evaporating materials. It is preferable that the first high refractive index layer 12 is an ITO-P layer.

Figure 5:
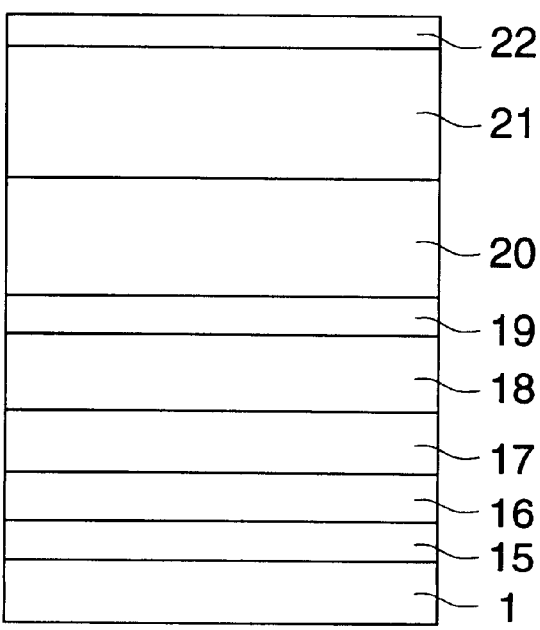
FIG. 5 shows a concrete example of the structure wherein third low refractive index layer 16, first high refractive index layer 17, first low refractive index layer 18, third high refractive index layer 19, second high refractive index layer 20 and second low refractive index layer 21 are layered in this order from the transparent base material 1 which is provided thereon with hard coat 15, and water-repelling coat 22 is further provided on the outermost surface.

Next, FIG. 5 shows a concrete example of the structure wherein third low refractive index layer 16, first high refractive index layer 17, first low refractive index layer 18, third high refractive index layer 19, second high refractive index layer 20 and second low refractive index layer 21 are laminated in succession from transparent base material 1 on which hard coat 15 is provided, and water-repelling coat 22 is provided on the outermost surface. By arranging the high refractive index layer and the low refractive index layer alternately as stated above, it is possible to prevent reflection of light and thereby to make a screen easy to see, which is preferable.

The first low refractive index layer 18, the second low refractive index layer 21 and the third low refractive index layer 16 are made of silicon oxide. In the concrete example in FIG. 5, the third low refractive index layer 16 has the lowest density, the first low refractive index layer 18 has medium density and the second low refractive index layer 21 has the highest density.

The first high refractive index layer 17, the second high refractive index layer 20 and the third high refractive index layer 19 represent a transparent and conductive layer made of ITO whose sheet resistivity is 100 Ω/cm² or less. The third high refractive index layer 19 and the first high refractive index layer 17 have the same density, and the second high refractive index layer 20 is higher than the third high refractive index layer 19 and the first high refractive index layer 17 in terms of density.

The third high refractive layer 19 and the first high refractive layer 17 represent an ITO-P layer which is made under vacuum with a mixture of indium oxide and tin oxide serving as evaporating material and the second high refractive layer 20 is an ITO-M layer which is made through simultaneous evaporation and oxidization under vacuum with indium and tin (metal) both serving as evaporating materials.

Namely, in the concrete example shown in FIG. 5, it is possible either to consider that the first layer of the invention is the third low refractive index layer 16 and the second layer of the invention is the second low refractive index layer 21 or to consider that the first layer of the invention is the first low refractive index layer 18 and the second layer of the invention is the second low refractive index layer 21. Or, the first layer of the invention is considered to be the third low refractive index layer 16 and the second layer of the invention is considered to be the first low refractive index layer 18. Or, the first layer of the invention is considered to be the first high refractive index layer 17 and the second layer of the invention is considered to be the second high refractive index layer 20. Or, it is also possible to consider that the first layer of the invention is the third high refractive index layer 19 and the second layer of the invention is the second high refractive index layer 20.

In the layer structure of the electromagnetic wave attenuating transparent member of the invention, more layers may naturally be provided without being limited to the layer structures in FIGS. 1–5.

There will be shown as follows a preferable example of conditions for evaporation, concerning the occasion wherein three low refractive index layers made of silicon oxide are provided and each layer has different density as in the example in FIG. 5.

A transparent thin layer of the low refractive index layer located to be closest to the transparent base material is a silicon oxide layer formed through a vacuum evaporation method, and its evaporation conditions (L1) are as follows.

| | |
|---|---|
| Oxygen gas pressure | 2–3 × 10⁻²PAS |
| Base plate temperature | 70–90° C. |
| Evaporation speed | 2–5Å/sec |
| Layer thickness | 120–200Å |

A transparent thin layer of the low refractive index layer located midway is a silicon oxide layer formed through a vacuum evaporation method, and its evaporation conditions (L2) are as follows.

| | |
|---|---|
| Oxygen gas pressure | 1.5 × 10⁻²PAS |
| Base plate temperature | 70–90° C. |
| Evaporation speed | 10–20Å/sec |
| Layer thickness | 250–300Å |

A transparent thin layer of the low refractive index layer located to be farthest from the transparent base material is a silicon oxide layer formed through a vacuum evaporation method, and its evaporation conditions (L3) are as follows.

| | |
|---|---|
| Oxygen gas pressure | $5 \times 10^{-3}$ PAS |
| Base plate temperature | 70–90° C. |
| Evaporation speed | 30–50Å/sec |
| Layer thickness | 800–900Å |

Under the evaporation conditions for the low refractive index layer stated above, a single layer with a thickness of 1000 Å was evaporated on a polycarbonate resin base plate, then, the layer hardness was tested by a steel wool test, and the layer structure was checked by observing a section of the layer under an electron microscope. Results of them are shown in Table 1.

TABLE 1

| Evaporation conditions | L1 | L2 | L3 |
|---|---|---|---|
| Layer hardness | Low | Medium | High |
| Layer structure (Density) | High | Medium | High |

Next, there will be shown an example of evaporation conditions for the occasion wherein two high refractive index layers each being made of ITO are provided and density of each layer is different each other as shown in FIG. 3.

A transparent thin layer of the high refractive index layer located to be closest to the transparent base material is an indium tin oxide layer formed through an RF ion plating evaporation method, and its evaporation conditions (H1) are as follows.

| | |
|---|---|
| Oxygen gas pressure | $2–3 \times 10^{-2}$ FAS |
| Base plate temperature | 70–90° C. |
| Evaporation material | Sintered body of indium tin oxide (Sn content 5–10 wt %) |
| Evaporation speed | 200–120Å/min |
| RF discharge power | 700–800W |
| Layer thickness | 100–200Å |

A transparent thin layer of the high refractive index layer located to be farthest from the transparent base material is an indium tin oxide layer formed through an RF ion plating method, and its evaporation conditions (H2) are as follows.

| | |
|---|---|
| Oxygen gas pressure | $2–3 \times 10^{-2}$ PAS |
| Base plate temperature | 70–90° C. |
| Evaporation material | Binary evaporation with evaporation source of In metal and Sn metal |
| Evaporation speed | In metal 200–120Å/min Sn metal 12–6Å/min |
| RF discharge power | 800–900W |
| Layer thickness | 900–1100Å |

Under the evaporation conditions for the high refractive index layer stated above, a single layer with a thickness of 1000 Å was evaporated on a polycarbonate resin base plate, and the layer structure was checked by observing a section of the layer under an electron microscope. In the case of H1, many grains were generated to show feeling of coarseness, and density was low. In the case of H2, on the other hand, layer accumulation was uniform and grains generated were less, resulting in high density.

When an electromagnetic wave attenuating transparent member of the invention is a positive meniscus lens in the case of a meniscus lens (for example, a spectacle lens), it is preferable that plural structural layers are provided on the convex surface side of the positive meniscus lens. In the case of a negative meniscus lens, on the other hand, it is preferable that plural structural layers are provided on the concave surface side of the negative meniscus lens.

With regard to the meniscus lens stated above, when a thickness of a transparent and conductive layer is 1000 Å or more, an effect is more conspicuous, which is preferable.

EXAMPLE 1

There was made an electromagnetic wave attenuating transparent member on which six structural layers were provided on the transparent base material as follows.

Transparent Base Polycarbonate Resin Flat Plate Material

| | | |
|---|---|---|
| Layer 1 (closest to transparent base material) | Silicon oxide layer (low refractive index layer) formed by vacuum evaporation method | |
| | Evaporation material | Silicon dioxide |
| | Oxygen gas pressure (in the course of evaporation) | $3 \times 10^{-2}$ PAS |
| | Base plate temperature | Heated to 90° C. |
| | Evaporation speed | 3Å/sec |
| | Layer thickness | 125Å |
| Layer 2 | Indium tin oxide layer (high refractive index layer (transparent and conductive layer)) formed by RF ion plating evaporation method | |
| | Evaporation material | Sintered body of indium tin oxide |
| | Oxygen gas pressure Oxygen gas pressure (in the course of evaporation) | $2 \times 10^{-2}$ PAS |
| | Base plate temperature | Heated to 90° C. |
| | Evaporation speed | 180Å/sec |
| | RF discharge power | 700W |
| | Layer thickness | 150Å |
| Layer 3 | Silicon oxide layer (low refractive index layer) formed by vacuum evaporation method | |
| | Evaporation material | Silicon dioxide |
| | Oxygen gas pressure Oxygen gas pressure (in the course of evaporation) | $1.5 \times 10^{-2}$ PAS |
| | Base plate temperature | Heated to 90° C. |
| | Evaporation speed | 10Å/sec |
| | Layer thickness | 200Å |
| Layer 4 | Indium tin oxide layer (high refractive index layer (transparent and conductive layer)) formed by RF ion plating evaporation method | |
| | Evaporation conditions | Same as those for Layer 2 |
| | Layer thickness | 100Å |
| Layer 5 | Indium tin oxide layer (high refractive index layer (transparent and conductive layer)) formed by RF ion plating evaporation method | |
| | Evaporation material | Indium metal and tin metal |

-continued

|  |  |  |
|---|---|---|
|  | Oxygen gas pressure Oxygen gas pressure (in the course of evaporation) | $2 \times 10^{-2}$ PAS |
|  | Base plate temperature | Heated to 90° C. |
|  | Evaporation speed | Indium metal 180Å/min Tin metal 5Å/min |
|  | RF discharge power | 800W |
|  | Layer thickness | 940Å |
| Layer 6 (farthest from transparent base material) | Silicon oxide layer (low refractive index layer) formed by vacuum evaporation method |  |
|  | Evaporation material | Silicon dioxide |
|  | Oxygen gas pressure Oxygen gas pressure (in the course of evaporation) | $5 \times 10^{-3}$ PAS |
|  | Base plate temperature | Heated to 90° C. |
|  | Evaporation speed | 40Å/sec |
|  | Layer thickness | 800Å |

A layer thickness and a refractive index of each layer are as follows.

|  | Layer thickness (Å) | Refractive index |
|---|---|---|
| Layer 1 | 125 | 1.40 |
| Layer 2 | 150 | 1.95 |
| Layer 3 | 200 | 1.40 |
| Layer 4 | 100 | 1.95 |
| Layer 5 | 940 | 1.95 |
| Layer 6 | 800 | 1.40 |

This electromagnetic wave attenuating transparent member was excellent in terms of optical antireflection efficiency, adhesion (tape peeling test, cross cutting method) and resistance to surroundings (judged by layer peeling and color unevenness of a layer color after being left for one week under 60° C. of temperature and 90% of humidity), sheet resistivity was 30 $\Omega/cm^2$ and electromagnetic wave shielding efficiency was 25 dB.

EXAMPLE 2

In Example 1, the one in which a hard coat composed of UV hardenable resins is formed on a polycarbonate resin was used as a base material, the oxygen gas pressure in evaporation of the second layer was made to be $3 \times 10^{-2}$ PAS, RF discharge power 650 W was impressed, gas pressure in evaporation of the sixth layer was made to be $3 \times 10^{-3}$ PAS, and evaporation speed was made to be 50 Å/sec. Other conditions were the same as those in Example 1.

EXAMPLE 3

In Example 1, the second layer was made to be a mixture layer of indium oxide and zinc oxide formed through an RF ion plating evaporation method by using a mixed and sintered body of indium oxide and zinc oxide as evaporation materials.

The fourth layer was made to be a mixed layer which is the same as the second layer, and the layer thickness was made to be 110 Å. The fifth layer was made to be a mixed layer of indium oxide and zinc oxide formed through an RF ion plating evaporation method. As evaporation materials, indium metal and zinc metal were used, and evaporation speed was made to be 170 Å/sec for indium metal and 5 Å/sec for zinc metal under oxygen pressure $2 \times 10^{-2}$ PAS. Other layers are the same as in Example 1.

EXAMPLE 4

In Example 1, the fourth layer was provided on the same condition as in the fifth layer. Other layers were the same as those in Example 1.

EXAMPLE 5

A positive-meniscus-shaped lens formed with polycarbonate resin was made to be a transparent base material, and structural layers of Example 1 were formed on the convex surface of the transparent base material.

Examples stated above are evaluated in the Table 2 below.

TABLE 2

|  | Examples | | | | |
|---|---|---|---|---|---|
|  | 1 | 2 | 3 | 4 | 5 |
| Sheet Resistivity | 30 | 30 | 30 | 30 | 30 |
| Optical antireflection efficiency | A | A | A | A | A |
| Adhesion | A | A | A | A | A |
| Resistance to surroundings | A | A | A | B | A |
| Electromagnetic wave shielding efficiency (dB) | 25 | 25 | 25 | 25 | 25 |
| Plate wear | A | A | A | A | A |

Sheet resistivity ($\Omega/cm^2$): Measured by a four probe method.

Optical antireflection efficiency: Measured by an automatic spectrophotometer.

Adhesion: Checked by a tape peeling test (cross cutting method).

Rate of measure for coat residual quantify (F)

A: $F \geq 90\%$

B: $90 \geq F \geq 70\%$

C: $70\% > F$

Resistance to surroundings:

: Evaluation of appearance after leaving for one week under temperature of 60° C. and humidity of 90%

A: Neither "Layer floated off" nor color unevenness (very good in practical use)

B: "Layer floated off" and color unevenness exist (no problem in practical use)

C: "Layer floated off" and color unevenness exist (problematic in practical use)

Electromagnetic wave shielding efficiency:

Attenuation factor in electromagnetic waves by input signal of 100 MHz was measured.

Excellent in practical use with 25 dB or more

Plate wear:

Scratches were observed after rubbing with steel wool (mesh 0000) under load of 50 g.

A: Microscopic scratches (no problem in practical use)

C: Much scratches (problematic in practical use) (Examples 6–19)

An order of the layers from the top to the bottom in the Table represents the order in which the layers are laminated on the transparent base material in a way that the topmost one in the Table is closest to the transparent base material.

TABLE 3

| | Example 6 |
|---|---|
| Transparent base material | Polycarbonate (Base plate temperature Ts 60° C.) |
| Layer 1 | Silicon oxide evaporation source<br>Vacuum evaporation method<br>Oxygen gas pressure $1.5 \times 10^{-2}$ PAS<br>Evaporation rate 5Å/sec Layer thickness t 400Å silicon oxide |
| Layer 2 | ITO (Indium tin oxide 5w % mixture) evaporation source<br>RF ion plating method<br>Oxygen gas pressure $1.5 \times 10^{-2}$ PAS<br>RF discharge power 700W<br>evaporation rate 2Å/sec<br>Layer thickness t 150Å ITO |
| Layer 3 | Same condition as Layer 1<br>Layer thickness t 350Å |
| Layer 4 | In, Sn binary evaporation source<br>RF ion plating method<br>Oxygen gas pressure $1.5 \times 10^{-2}$ PAS<br>RF discharge power 700W<br>Evaporation rate<br>In evaporation source 2Å/sec<br>Sn evaporation source 0.1Å/sec<br>Layer thickness t 500Å ITO |
| Layer 5 | Silicon oxide evaporation source<br>Same condition as Layer 1<br>t = 150Å<br>Silicon oxide layer |
| Layer 6 | Same condition as Layer 4 stated above<br>t = 600Å |
| Layer 7 | Silicon oxide evaporation source<br>Vacuum evaporation<br>Oxygen gas pressure $1.0 \times 10^{-2}$ PAS<br>Evaporation rate 30Å/sec,<br>Layer thickness t 790Å silicon oxide |
| Resistance to surroundings | Coat color change  A<br>Layer floated off  A |

TABLE 4

| | Example 7 | Example 8 |
|---|---|---|
| Transparent base material | Polycarbonate (Ts 70° C.) with UV hardenable hard coat resin layer | Polycarbonate (Ts 70° C.) |
| Layer 1 | Same condition as Layer 1 in Example 6 t = 400Å | Same condition as Layer 1 in Example 6 t = 400Å |
| Layer 2 | Same condition as Layer 2 in Example 6 t = 160Å | Binary evaporation source of indium oxide and zinc oxide<br>RF ion plating<br>Oxygen gas pressure $1.5 \times 10^{-2}$ PAS<br>RF discharge power 700W<br>Evaporation rate<br>Indium oxide evaporation source 2Å/sec<br>Zinc oxide evaporation source 0.1Å/sec<br>t = 180Å layer of mixture oxide of indium oxide and zinc |
| Layer 3 | Same condition as Layer 3 in Example 6 t = 280Å | Same condition as Layer 1 in Example 6 t = 250Å |
| Layer 4 | Same condition as Layer 4 in Example 6 t = 500Å | Same condition as Layer 4 in Example 6 t = 500Å |
| Layer 5 | Zirconium oxide evaporation source<br>Vacuum evaporation method<br>Oxygen gas pressure $1.5 \times 10^{-2}$ PAS<br>Evaporation rate 2Å/sec<br>t = 50Å zirconium oxide layer | Titanium oxide evaporation source<br>Vacuum evaporation method<br>Oxygen gas pressure $1.6 \times 10^{-2}$ PAS<br>Evaporation rate 2.2Å/sec<br>t = 50Å |
| Layer 6 | Same condition as Layer 5 stated above<br>t = 600Å | Binary evaporation source of indium and zinc oxide<br>RF ion plating<br>Oxygen gas pressure $1.6 \times 10^{-2}$ PAS<br>RF discharge power 710W<br>Evaporation rate<br>Indium evaporation source 2Å/sec<br>Zinc oxide 0.08Å/sec<br>t = 600Å layer of mixture oxide of indium oxide and zinc |
| Layer 7 | Same condition as Layer 7 in Example 6<br>t = 800Å | Same condition as Layer 7 in Example 6<br>t = 500Å |
| Coat color change | B | B |
| Layer floated off | A | A |

TABLE 5

| | Example 9 | Example 10 |
|---|---|---|
| Transparent base material | Zeonex resin (Ts 80° C.) | Polycarbonate (Ts 75° C.) |
| Layer 1 | Same condition as Layer 1 in Example 6<br>t = 400Å | Same condition as Layer 1 in Comparative Example 6<br>t = 400Å |
| Layer 2 | Same condition as Layer 2 in Example 6<br>t = 150Å | Same condition as Layer 2 in Example 6<br>t = 181Å |
| Layer 3 | Same condition as Layer 1 in Example 6<br>t = 250Å | Same condition as Layer 1 in Example 6<br>t = 250Å |
| Layer 4 | Same condition as Layer 4 in Example 7<br>t = 500Å | Same condition as Layer 4 in Example 7<br>t = 500Å |
| Layer 5 | Tantalum oxide evaporation source<br>Vacuum evaporation method<br>Oxygen gas pressure $1.5 \times 10^{-2}$ PAS<br>Evaporation rate 2.3Å/sec<br>t = 50Å | Same condition as Layer 2 in Example 6<br>t = 50Å |
| Layer 6 | Same condition as Layer 6 in Example 6<br>t = 600Å layer of mixture oxide of indium oxide and tin | Same condition as Layer 6 in Example 6<br>t = 606Å |
| Layer 7 | Same condition as Layer 7 in Example 6<br>t = 800Å | Same condition as Layer 7 in Example 6<br>t = 805Å |
| Coat color change | B | B |
| Layer floated off | A | A |

TABLE 6

|  | Example 11 | Example 12 |
|---|---|---|
| Transparent base material | Polycarbonate (with hard coat Ts 80° C.) | Polycarbonate (Ts 70° C.) |
| Layer 1 | Same condition as Layer 1 in Example 6 t = 400Å | Same condition as Layer 1 in Example 6 t = 300Å |
| Layer 2 | Same condition as Layer 2 in Example 6 t = 152Å | Same condition as Layer 5 in Example 7 t = 100Å |
| Layer 3 | Same condition as Layer 3 in Example 6 t = 270Å | Same condition as Layer 3 in Example 6 t = 280Å |
| Layer 4 | Same condition as Layer 6 in Example 6 t = 300Å | Same condition as Layer 6 in Example 6 t = 300Å |
| Layer 5 | Same condition as Layer 1 in Example 6 t = 50Å | Same condition as Layer 1 in Example 6 t = 100Å |
| Layer 6 | Same condition as Layer 4 above t = 500Å | Same condition as Layer 4 above t – 606Å t = 500Å |
| Layer 7 | Same condition as Layer 5 above t = 30Å | Same condition as Layer 5 in Example 7 t = 60Å |
| Layer 8 | Same condition as Layer 4 above t = 300Å | Same condition as Layer 4 above t = 300Å |
| Layer 9 | Same condition as Layer 7 in Example 6 t = 800Å | Same condition as Layer 7 in Example 6 t = 820Å |
| Coat color change | A | A |
| Layer floated off | A | A |

TABLE 7

|  | Example 13 | Example 14 |
|---|---|---|
| Transparent base material | Polycarbonate (with hard coat Ts 70° C.) | Zeonex (Ts 80° C.) |
| Layer 1 | Same condition as Layer 1 in Example 6 t = 400Å | Same condition as Layer 1 in Example 6 t = 400Å |
| Layer 2 | Same condition as Layer 2 in Example 6 t = 160Å | Titanium oxide evaporation source Vacuum evaporation rnethod Oxygen gas pressure 2 × 10⁻²PAS Evaporation rate 2Å/sec t = 80Å |
| Layer 3 | Same condition as Layer 3 in Example 6 t = 160Å | Same condition as Layer 3 in Example 6 t = 200Å |
| Layer 4 | Zirconium oxide evaporation source Vacuum evaporation method Oxygen gas pressure 1.5 × 10⁻²PAS Evaporation rate 3Å/sec t = 20Å | Zirconium oxide evaporation source Vacuum evaporation method Oxygen gas pressure 1.5 × 10⁻²PAS Evaporation rate 2Å/sec t = 20Å |
| Layer 5 | Silicon oxide evaporation source Same condition as Layer 1 in Example 6 t = 100Å | Silicon oxide evaporation source Same condition as Layer 1 in Example 6 t = 70Å |
| Layer 6 | Same condition as Layer 6 in Example 6 t = 1100Å | Same condition as Layer 6 in Example 6 t = 1100Å |

TABLE 7-continued

|  | Example 13 | Example 14 |
|---|---|---|
| Layer 7 | Same condition as Layer 7 in Example 6 t = 765Å | Same condition as Layer 7 in Example 6 t = 765Å |
| Coat color change | B | A |
| Layer floated off | A | A |

TABLE 8

|  | Example 15 | Example 16 |
|---|---|---|
| Transparent base material | Polycarbonate (Ts 70° C.) | Polycarbonate (Ts 70° C.) |
| Layer 1 | Same condition as Layer 1 in Example 6 t = 400Å | Same condition as Layer 1 in Example 6 t = 402Å |
| Layer 2 | Same condition as Layer 2 in Example 6 t = 100Å | Same condition as Layer 2 in Example 6 |
| Layer 3 | Same condition as Layer 3 in Example 6 t = 200Å | Same conditionas Layer 3 in Example 6 t = 180Å |
| Layer 4 | Titanium oxide or tantalum oxide evaporation source Same condition as Layer 4 in Example 13 t = 20Å | Evaporation source of mixture of zirconium oxide and titanium oxide Same condition as Layer 4 in Example 13 t = 20Å |
| Layer 5 | Silicon oxide evaporation source Same condition as Layer 1 in Example 6 t = 70Å | Silicon oxide evaporation source Same condition as Layer 1 in Example 6 t = 70Å |
| Layer 6 | Same condition as Layer 6 in Example 6 t = 1100Å | Same condition as Layer 6 in Example 6 t = 1100Å |
| Layer 7 | Same condition as Layer 7 in Example 6 t = 765Å | Same condition as Layer 7 in Example 6 t = 810Å |
| Coat color change | B | A |
| Layer floated off | A | A |

TABLE 9

|  | Example 17 |
|---|---|
| Transparent base material | Polycarbonate (Ts 60° C.) |
| Layer 1 | Same condition as Layer 2 in Example 14 t = 150Å |
| Layer 2 | Same condition as Layer 3 in Example 6 t = 350Å |
| Layer 3 | Same condition as Layer 4 in Example 6 t = 600Å |
| Layer 4 | Same condition as Layer 5 in Example 6 t = 50Å |
| Layer 5 | Same condition as Layer 6 |

TABLE 9-continued

| | Example 17 | |
|---|---|---|
| | | in Example 6 |
| | | t = 500Å |
| Layer 6 | | Same condition as Layer 7 |
| | | in Example 6 |
| | | t = 850Å |
| Coat color change | B | |
| Layer floated off | A | |

TABLE 10

| | Example 18 | Example 19 |
|---|---|---|
| Transparent base material | Polycarbonate (Ts 60° C.) | Polycarbonate (Ts 60° C.) |
| Layer 1 | Same condition as Layer 2 in Example 12 t = 150Å | Same condition as Layer 2 in Example 6 t = 40Å |
| Layer 2 | Same condition as Layer 3 in Example 6 t = 200Å | Same condition as Layer 3 in Example 6 t = 130Å |
| Layer 3 | Same condition as Layer 4 in Example 11 t = 300Å | Same condition as Layer 4 in Example 14 t = 100Å |
| Layer 4 | Same condition as Layer 5 in Example 11 t = 30Å | Same condition as Layer 5 in Example 14 t = 200Å |
| Layer 5 | Same condition as Layer 6 in Example 11 t = 500Å | Same condition as Layer 6 in Example 14 t = 1100Å |
| Layer 6 | Same condition as Layer 7 in Example 11 t = 30Å | Same condition as Layer 7 in Example 6 t = 800Å |
| Layer 7 | Same condition as Layer 8 in Example 11 t = 300Å | |
| Layer 8 | Same condition as Layer 7 in Example 6 t = 850Å | |
| Coat color change | A | B |
| Layer floated off | A | A |

A degree of the change in a coat color caused by leaving for one week under the environmental conditions of 60° C. and 90% with regard to the resistance to surroundings is shown with the following symbols;

C: A change is great and not suitable for practical use
B: A change is small and no problem
A: No change and no problem while a degree of the layer floated off is shown with the following symbols.
C: Layer floated off in streaks and not suitable for practical use
A: No layer floated off and no problem Layer structures of the present Examples 6–19 showed no problem in terms of resistance to surroundings. In addition, the optical characteristic (antireflection efficiency) was excellent, sheet resistivity of 50 Ω/cm² or less was possible in terms of an electromagnetic wave attenuating effect, and attenuation factor in the electromagnetic wave of input signal 100 MHz was 25 dB or more, which indicated that they were satisfactory in practical use.

As a result of the foregoing, the invention has proved to be a highly environment-durable electromagnetic wave attenuating and antireflection layer which can effectively intercept electromagnetic waves generated from various equipment, and can lighten fatigue of eyes without disturbing the field range.

The invention makes it possible to provide an electromagnetic wave attenuating transparent member which can effectively intercept electromagnetic waves generated from office automation equipment, cathode ray tubes of TV sets and other equipment, and has an effect that a coat color is not changed and a layer is not floated off in a streak shape when the transparent member is left under the conditions of high temperature and high humidity (for example, temperature of 60° C. and humidity of 90%), namely an electromagnetic wave attenuating transparent member which is highly resistant to surroundings. In addition, it is also possible to provide an electromagnetic wave attenuating transparent member which has an excellent antireflection effect and can lighten fatigue of eyes without interrupting the field range.

Disclosed embodiment can be varied by a skilled person without departing from the spirit and scope of the invention.

What is claimed is:

1. An electromagnetic wave attenuating transparent member comprising:
   a transparent base material, and
   a plurality of structural layers including at least one transparent conductive layer,
      wherein sheet resistivity of the electromagnetic wave attenuating transparent member is 100 Ω/cm² or less, and the plurality of structural layers include a first layer and a second layer which is provided to be farther than the first layer from the transparent base material, and has density which is higher than that of the first layer;
      wherein the first layer and the second layer are made of the same material;
      wherein the first layer and the second layer represent low refractive index layers; and
      wherein the first layer and the second layer are layers separate from each other.

2. The electromagnetic wave attenuating transparent member of claim 1, wherein the same material is silicon oxide.

3. The electromagnetic wave attenuating transparent member of claim 1, wherein the transparent base material is a lens.

4. The electromagnetic wave attenuating transparent member of claim 3, wherein a direction of stress of the plurality of structural layers is the same as that of deformation of the transparent base material in terms of a surface thereof.

5. The electromagnetic wave attenuating transparent member of claim 4, wherein the lens is a positive meniscus lens and the plurality of structural layers are provided on the convex side.

6. The electromagnetic wave attenuating transparent member of claim 4, wherein the lens is a negative meniscus lens and the plurality of structural layers are provided on the concave side.

7. The electromagnetic wave attenuating transparent member of claim 1, wherein the transparent base material is in a film shape.

8. The electromagnetic wave attenuating transparent member of claim 1, wherein the transparent base material is a flat plate.

9. The electromagnetic wave attenuating transparent member of claim 1, wherein the transparent base material is made of plastic.

10. The electromagnetic wave attenuating transparent member of claim 1, wherein the transparent base material is made of glass.

11. An electromagnetic wave attenuating transparent member comprising:

a transparent base material, and a plurality of structural layers including at least one transparent conductive layer, wherein sheet resistivity of the electromagnetic wave attenuating transparent member is 100 $\Omega/cm^2$ or less, and the plurality of structural layers include a first layer and a second layer which is provided to be farther than the first layer from the transparent base material, and has density which is higher than that of the first layer;

wherein the first layer and the second layer are made of the same material;

wherein the second layer is the transparent conductive layer;

wherein the first layer is also the transparent conductive layer;

wherein both the first layer and the second layer represent high refractive index layers; and wherein the first layer and the second layer are layers separate from each other.

12. The electromagnetic wave attenuating transparent member of claim 11, wherein said same material contains indium oxide or indium.

13. The electromagnetic wave attenuating transparent member of claim 12, wherein said same material is a mixture of indium oxide and tin oxide.

14. The electromagnetic wave attenuating transparent member of claim 11, wherein the transparent base material is a lens.

15. The electromagnetic wave attenuating transparent member of claim 14, wherein a direction of stress of the plurality of structural layers is the same as that of deformation of the transparent base material in terms of a surface thereof.

16. The electromagnetic wave attenuating transparent member of claim 15, wherein the lens is a positive meniscus lens and the plurality of structural layers are provided on the convex side.

17. The electromagnetic wave attenuating transparent member of claim 15, wherein the lens is a negative meniscus lens and the plurality of structural layers are provided on the concave side.

18. The electromagnetic wave attenuating transparent member of claim 11, wherein transparent material in a shape.

19. The electromagnetic wave attenuating transparent member of claim 11, wherein the transparent base material is a flat plate.

20. The electromagnetic wave attenuating transparent member of claim 11, wherein the transparent base material is made of plastic.

21. The electromagnetic wave attenuating transparent member of claim 11, wherein the transparent base material is made of glass.

22. An electromagnetic wave attenuating transparent member comprising:

a transparent base material, and a plurality of structural layers including at least one transparent conductive layer, wherein sheet resistivity of the electromagnetic wave attenuating transparent member is 100 $\Omega/cm^2$ or less, and the plurality of structural layers include a first layer and a second layer which is provided to be farther than the first layer from the transparent base material, and has density which is higher than that of the first layer;

wherein the second layer is the transparent conductive layer;

wherein the first layer is also the transparent conductive layer;

wherein the first layer and the second layer are made of the same material;

wherein both the first layer and the second layer represent high refractive index layers; and wherein the first layer and the second layer adjoin each other.

23. The electromagnetic wave attenuating transparent member of claim 22, wherein said same material contains indium oxide or indium.

24. The electromagnetic wave attenuating transparent member of claim 22, wherein said same material is a mixture of indium oxide and tin oxide.

25. The electromagnetic wave attenuating transparent member of claim 22, wherein the transparent base material is a lens.

26. The electromagnetic wave attenuating transparent member of claim 25, wherein a direction of stress of the plurality of structural layers is the same as that of deformation of the transparent base material in terms of a surface thereof.

27. The electromagnetic wave attenuating transparent member of claim 26, wherein the lens is a positive meniscus lens and the plurality of structural layers are provided on the convex side.

28. The electromagnetic wave attenuating transparent member of claim 26, wherein the lens is a negative meniscus lens and the plurality of structural layers are provided on concave side.

29. The electromagnetic wave attenuating transparent member of claim 22, wherein the transparent base material is in a film shape.

30. The electromagnetic wave attenuating transparent member of claim 22, wherein the transparent base material is a flat plate.

31. The electromagnetic wave attenuating transparent member of claim 22, wherein the transparent base material is made of plastic.

32. The electromagnetic wave attenuating transparent member of claim 22, wherein the transparent base material is made of glass.

* * * * *

UNITED STATES PATENT AND TRADEMARK OFFICE
CERTIFICATE OF CORRECTION

PATENT NO. : 6,319,598 B1
DATED : November 20, 2001
INVENTOR(S) : Satoshi Nakano et al.

It is certified that error appears in the above-identified patent and that said Letters Patent is hereby corrected as shown below:

Column 25,
Lines 49-50, "wherein transparent material in a shape" should read -- wherein the transparent base material is in a film shape --.

Column 26,
Line 45, before "concave side", insert -- the --.

Signed and Sealed this

Twenty-seventh Day of August, 2002

Attest:

Attesting Officer

JAMES E. ROGAN
Director of the United States Patent and Trademark Office